US005602367A

United States Patent [19]

Meyer

[11] Patent Number: 5,602,367

[45] Date of Patent: Feb. 11, 1997

[54] MULTIPLE TUNED HIGH POWER BASS REFLEX SPEAKER SYSTEM

[75] Inventor: John D. Meyer, Berkeley, Calif.

[73] Assignee: Meyer Sound Laboratories Incorporated, Berkeley, Calif.

[21] Appl. No.: 359,522

[22] Filed: Dec. 19, 1994

[51] Int. Cl.[6] .................................................... H05K 5/00

[52] U.S. Cl. ........................... 181/156; 181/160; 181/145

[58] Field of Search .................................... 181/144, 145, 181/147, 148, 152, 156, 199

[56] References Cited

U.S. PATENT DOCUMENTS

| | | | |
|---|---|---|---|
| 3,165,587 | 1/1965 | Alderson | 181/147 |
| 4,164,988 | 8/1979 | Virva . | |
| 4,284,166 | 8/1981 | Gale | 181/156 |
| 4,289,929 | 9/1981 | Hathaway | 181/147 |
| 4,326,099 | 4/1982 | Maille . | |
| 4,730,694 | 3/1988 | Albarino | 181/199 X |
| 4,760,601 | 7/1988 | Pappanikolaou . | |
| 5,111,905 | 5/1992 | Rodgers . | |
| 5,147,986 | 9/1992 | Cockrum et al. | 181/156 X |
| 5,313,525 | 5/1994 | Klasco . | |
| 5,374,124 | 12/1994 | Edwards | 181/145 X |

*Primary Examiner*—Khanh Dang
*Attorney, Agent, or Firm*—Donald L. Beeson

[57] ABSTRACT

A bass reflex loud speaker system for use in high power applications which includes an enclosure with at least two, and preferably three, cone drivers mounted in front of separate and acoustically isolated bass reflex chambers. Each bass reflex chamber is tuned to a separate octave such that the bass reflex modules formed by each bass reflex chamber and its associate cone driver produces a complex acoustical signal comprised of different frequency components in the low frequency range at high sound pressure levels, but with minimum driver cone excursion and distortion.

15 Claims, 4 Drawing Sheets

MULTIPLE TUNED HIGH POWER BASS REFLEX SPEAKER SYSTEM

BACKGROUND OF THE INVENTION

Field of the Invention

The present invention relates to loudspeaker systems generally, and more particularly to a subwoofer system for producing frequencies in the low or bass range of the audio frequency spectrum.

Subwoofer systems designed to produce frequencies in the lower bass frequency range (generally below 200 Hertz) typically employ a bass reflex enclosure system using a single transducer (sometimes herein referred to as "drivers" or "cone drivers") placed in a large chamber having a port to tune the system to a desired low frequency. The port causes the back wave of the speaker to become in phase with the front or direct wave, thereby adding to the acoustical output of the system. In order to gain power from a bass reflex system, the system must be designed so that it is a high "Q" system. The disadvantages of high "Q" systems, however, is that they are generally effective over no more than one octave.

It is also known to provide a double tuned bass reflex enclosure in which the enclosure is configured with two tuned chambers in front and/or back of the speaker and in which each chamber is tuned to a different frequency. This and other similar systems using one driver (or two drivers in a push-pull configuration) to cover several octaves have the disadvantage of being inefficient and impractical in environments where large acoustical outputs are required. Where maximum efficiency is desired, an enclosure can only be optimally tuned for operation over one octave, even if the bass reflex enclosure is tuned to more than one frequency, i.e., is relatively broadband. This can be understood by the fact that the acoustical output of a driver is determined by the size of the driver's piston or cone and the cone's maximum excursion. At low frequencies the reflex enclosure behind the driver needs to have a large volume and needs a large diameter cone to move a large volume of air in the enclosure. At higher frequencies the cone and chamber need to be smaller in order to obtain high output. Using a large cone with a small tuned chamber to produce higher frequencies, or a small cone with a large tuned chamber to produce lower frequencies is inefficient.

Since bass reflex speaker systems have heretofore generally been limited to either producing one frequency at a time ("boom boxes") or to inefficient broader band systems, high output power systems capable of reproducing complex sounds, such as music, without distortion have not generally been available. For example, where a single driver is used with a broadband bass reflex design, the speaker, when driven with music, is generally capable of producing less than 0.5 acoustical watts, which may be appropriate for a home hi-fi system, but not for a speaker used in most commercial applications.

A related problem with conventional designed bass reflex systems is that, when the driver is forced to follow the complex music signal, the excursion of the driver cone, and hence the acoustical output of the driver, is limited. Conversely, when the speaker is driven to higher output powers at a single frequency, the driver will have no excursion left to produce other frequencies, meaning it cannot accurately reproduce a complex low frequency sound. For example, one 15-inch diameter driver can produce one acoustical watt at 50 Hertz with a maximum excursion of one inch. When the driver is placed in a sealed chamber, the back wave is lost, but when it is optimally tuned (a Heimholtz resonator) to 50 Hertz the speaker can produce up to two acoustical watts by utilizing the back wave. When operating at this full power, there is no advantage to any other tuned chamber associated with the driver because there is no excursion left in the driver to drive any other frequency.

The present invention overcomes the above limitations and trade-offs of conventional bass reflex speaker systems by providing an improved bass reflex speaker system capable of efficiently producing bass frequencies at high acoustical power levels, and to do so over substantially the entire bass region of the audio frequency spectrum, i.e., in the audio spectrum generally below 200 Hertz. Using a bass reflex speaker system in accordance with the invention, complex low frequency music signals can be accurately reproduced (i.e., without distortion) at high sound pressure levels suitable to commercial applications.

SUMMARY OF THE INVENTION

The present invention involves a bass reflex speaker system employing an enclosure loading technique that achieves high acoustical output while reducing the excursion of the speaker's transducer over the intended low frequency operating band width of the reflex system. More specifically, the invention combines separate, and preferably three separate, tuned reflex chambers, with each chamber being provided with its own transducer to provide separate bass reflex modules optimized to operate within different frequency bands below 200 Hertz. Preferably and more specifically, each bass reflex module is tuned one octave apart and designed to operate over a one octave bandwidth only. For example, the one bass reflex module can be tuned to 32 Hertz, the next bass reflex module to 64 Hertz, and a third bass reflex module to 128 Hertz. As hereinafter described, the size of the transducer (driver cone diameter) and volume of the reflex chamber for each bass reflex module will be selected so that each module will produce a desired acoustical power output, preferably approximately one watt of acoustic power.

The bass reflex speaker system of the invention is driven from a three-way cross-over circuit which separates the audio signal input into three one octave frequency bands, one for driving each of the separate bass reflex modules of the system. Thus, each bass reflex module only receives a signal input within the band to which it is tuned. The three channel cross-over circuit acts to keep out-of-band frequencies from entering the individual bass reflex modules.

The invention greatly increases the efficiency of the subwoofer system and decreases the required driver cone excursion, by taking advantage of the discovery that the peak power of the acoustical signal in front of the speaker is the square of the vector sum of the individual frequency components of the complex signal reproduced by the system. In the bass reflex system of the invention, a complex audio signal, such as music, is broken down into its different frequency components for the purpose of driving the separate bass reflex modules. Each bass reflex module thereby only has to produce a frequency within the module's octave frequency band. For example, the signal of a low frequency instrument, such as a drum, may be made up of three frequencies, 32, 64 and 128 Hertz (the fundamental plus harmonics). While the composite of such a signal may measure a peak of nine acoustical watts, each of the component acoustical signal will have an average power of only one acoustical watt. By taking advantage of this phenomenon, the bass reflex of the present invention can produce nine acoustical watts of peak power, while each of its individual drivers is producing only one watt. In other words, the system of the invention will provide nine times acoustical gain for complex signals.

Therefore, it is a primary object of the present invention to provide a bass reflex speaker system capable of producing high acoustical power for commercial uses. It is another object of the invention to provide a bass reflex speaker system capable of accurately producing complex low frequency signals, such as music, efficiently. It is still a further object of the invention to provide a bass reflex speaker system wherein the required excursion of the cone drivers, and distortion, is minimized at high output power levels. Other objects of the invention will be apparent from the following specification and claims.

DESCRIPTION OF THE ILLUSTRATED EMBODIMENT

Figure 1:
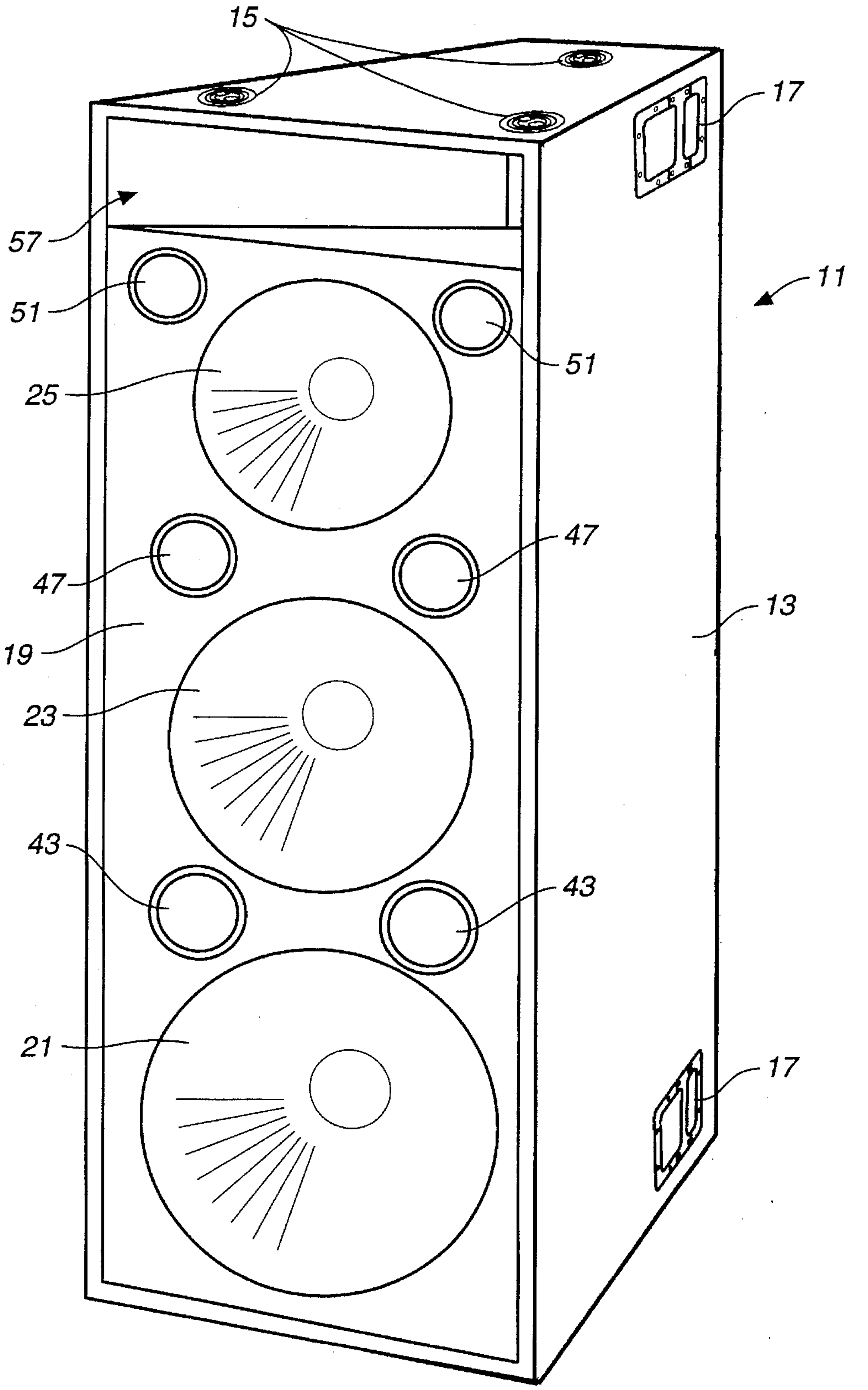
FIG. 1 is a top perspective view of a three way bass reflex speaker system in accordance with the invention.
Figure 2:
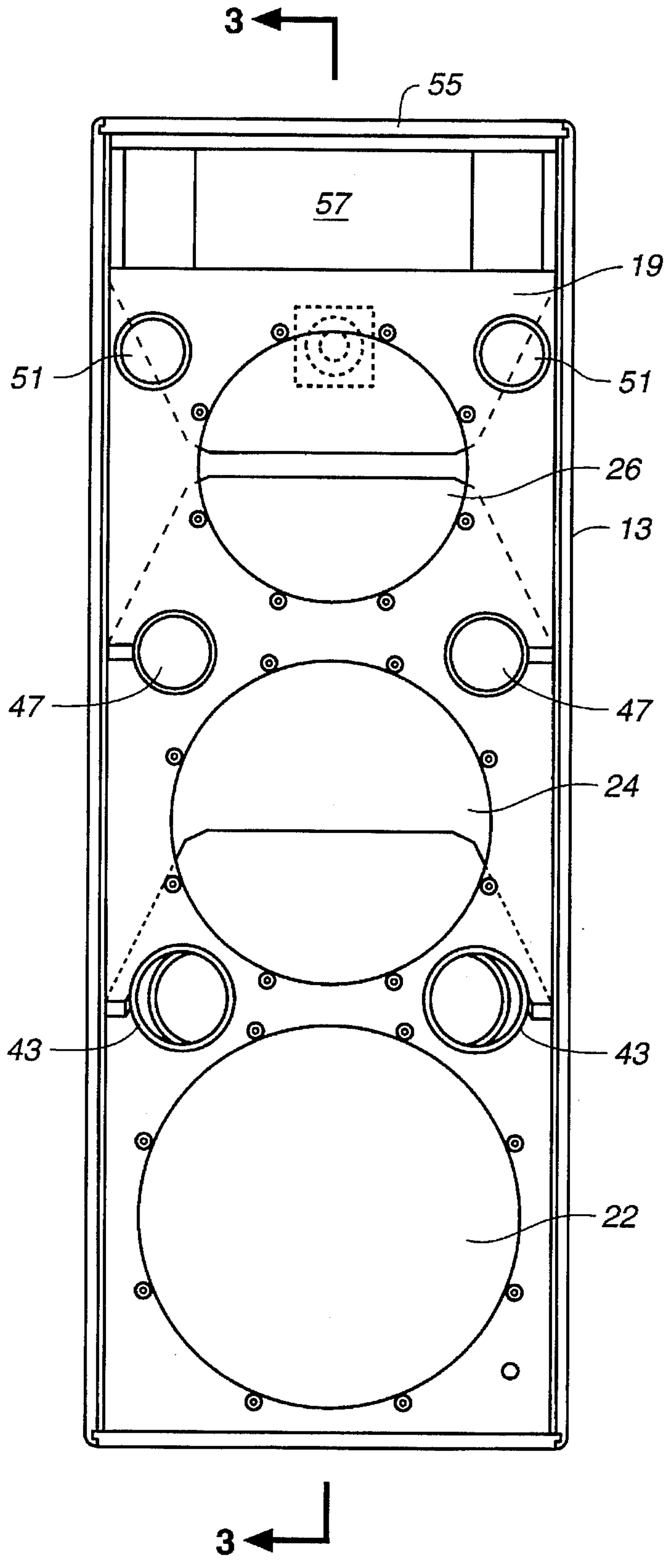
FIG. 2 is a front elevational view of the enclosure for the speaker system shown in FIG. 1.
Figure 3:
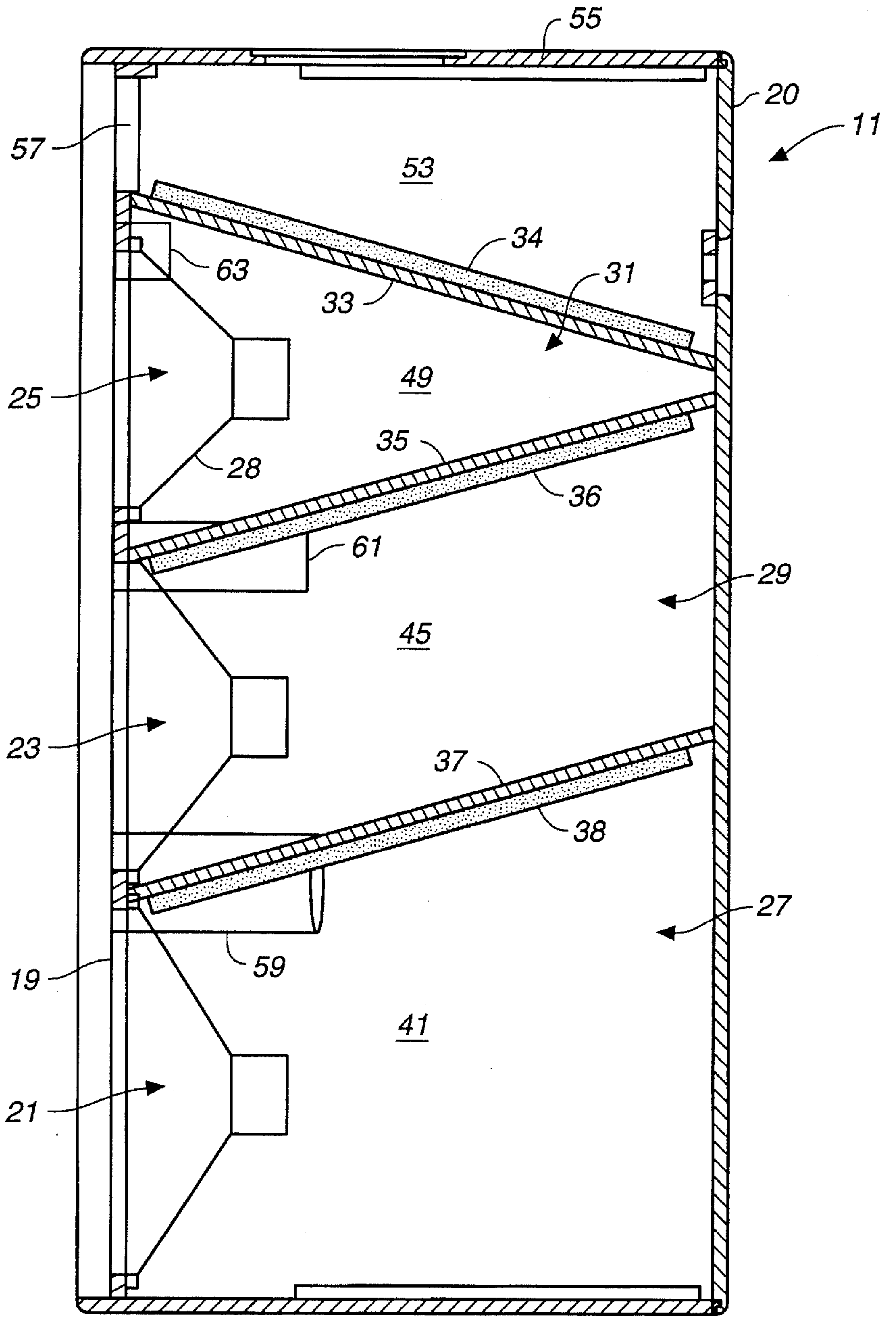
FIG. 3 is a cross sectional view in side elevation of the bass reflex speaker system shown in FIG. 1.

Referring now to the drawings, FIGS. 1–3 illustrate a bass reflex speaker system constructed in accordance with the invention, and particularly illustrate the construction of the speaker enclosure. To better illustrate the construction of the enclosure, the transducers (sometimes herein referred to as "drivers") have been removed from the speaker enclosure shown in FIG. 2.

Referring to FIGS. 1–3, bass reflex speaker system 11 includes a generally wedge-shaped speaker box or enclosure 13 having suitable rigging hardware 15 and lifting handles 17 in the top and sides of the enclosure. It is understood that, while the enclosure is shown as being a wedge-shaped enclosure, the invention is not limited to a wedge-shaped enclosure. Rather, the enclosure can be of any suitable shape, and specifically can suitably have a rectangular shape.

The speaker enclosure 13 has multiple forward facing drivers 21, 23, 25 mounted to a front baffle wall 19. It is specifically seen that three separate drivers of different diameters are mounted adjacent to each other to the front baffle wall having driver openings 22, 24, 26 (see FIG. 2) so that they are vertically aligned, with the largest driver 23 situated at the bottom of the baffle wall and the smallest driver at the top. It is noted that commercially available drivers have characteristic sizes which are specified in terms of the diameters of the driver's piston member (such as the cone identified by numeral 28 in FIG. 3). The size of the driver is selected in accordance with the criteria discussed below.

As best illustrated in FIG. 3, the bass reflex speaker system illustrated in the drawings consist of three separate bass reflex speaker modules 27, 29, 31, with each module comprised of a driver, a reflex chamber behind the driver, and two ports for porting the reflex chamber through the front baffle wall of the speaker. Each of the reflex chambers are acoustically isolated one from the other and are formed by partition walls 33, 35, 37 that extend the full width of the enclosure from the enclosure's from baffle wall 25 to its narrower back wall 20. The partition walls, which can be reinforced by suitable reinforcement elements such as glue blocks 34, 36, 38, particularly are seen to partition the internal volume of the enclosure into separate chambers including the bottom or first ported or reflex chamber 41 which together with the large diameter driver 23 and ports 43 form the bottom reflex module 26; a middle or second ported or reflex chamber 45 which together with the mid-sized driver 22 and ports 47 form the middle reflex module chamber 29; and a top or third ported chamber 49 which together with the smallest diameter driver 21 and ports 51 form the top reflex module 31. In addition to the aforementioned reflex chambers, an upper axillary chamber 53 is formed between the top partition wall 33 and the reinforced top wall 55 of the enclosure. A high frequency and/or midrange horn loaded driver (not shown) can be suitably mourned in this auxiliary chamber with the mouth of the horn positioned in the top, rectangularly shaped opening 57 above the front baffle wall of the enclosure.

The size of the drivers and volume of the reflex chambers associated with each driver should carefully be selected to achieve a suitable and approximately equal acoustic power output from each of the bass reflex modules 27, 29, 31. Preferably each module is designed to produce about one watt of acoustic power which for the bottom module 27 can be achieved using an 18 inch driver and a reflex module chamber of 6 cu. ft. In the middle module 29 one acoustic watt can be achieved using a 15 inch driver mounted in front of a 4 cu. ft. chamber, whereas this same power from the upper module 31 can be achieved from a driver size and chamber volume, respectively, of 12 inches and 2 cu. ft. The acoustic power in each case will depend on the volume of air displaced by the driver's cone, and with each of the module parameters set forth above, the module can produce one acoustic watt with driver cone excursions of no more than one inch.

The tuning and quality factor or "Q" of each of the acoustically isolated reflex chambers 41, 45, 49 is accomplished by the design of the ports 43, 47, 51 for each chamber in a manner well known in the art. Each of the reflex chambers is tuned one octave apart in the low frequency range below 200 Hertz, and has a band width that permits each of the reflex modules to operate over one octave only so that the drivers 21, 23, 25 of the bass reflex system produces frequencies only within its own frequency band. In this manner, a complex low frequency signal vectorally can be summed in the air in front of the speaker rather than having to sum frequency components electronically before the input to the drivers. As above mentioned, by forcing the separate frequency components of the low frequency audio signal to sum in the air, the excursion required of the individual drivers of the system to achieve high peak acoustical power level will be reduced.

It is noted that the ports of each of the reflex chambers consist of an opening of a defined diameter and a length, defined by the length of the tubes 59, 61, 63 which extend from the front baffle wall 19 back into the individual reflex chambers 41, 45, 49. As is well known in the art, the length of the tubes 59, 61, 63 can be selected to add resistive loading for increasing the bandwidth of the reflex chambers. Thus, the length of the tubes can be selected to establish an operating bandwidth of one octave for each bass reflex module. However, since resistive loading added by the tube will act to "de-tune" the chamber, such loading will have to be compensated for by increasing the diameter of the port.

It is found that a speaker system having separate reflex modules tuned and dimensioned as follows suitably accomplish the objects of the inventions:

| Driver Diameter | Frequency | Volume | Port Diameter | Tube Length |
|---|---|---|---|---|
| 18 inches | 32 | 6 cu. ft. | 4.0 ins. | 9.5 ins. |
| 15 inches | 64 | 4 cu. ft. | 3.0 ins. | 9.0 ins. |
| 12 inches | 128 | 2 cu. ft. | 2.5 ins. | 1.5 ins. |

It is understood, however, that the objects of the invention can be achieved using other tunings and driver/chamber specifications depending on the particular acoustical application and design criteria.

Each of the reflex modules of the invention can be powered by a separate amplifier fed by a three-way crossover which acts to divide the bass region of the audio input signal into the separate frequency components for which the reflex modules were designed. It is contemplated that a power amplifier for each of the bass reflex modules can be mounted directly inside the reflex chambers for the modules which it powers, with the cross-over circuitry also being incorporated within the speaker enclosure. Thus, a completely powered unit can be provided which can be fed with a low voltage line signal.

Figure 4:
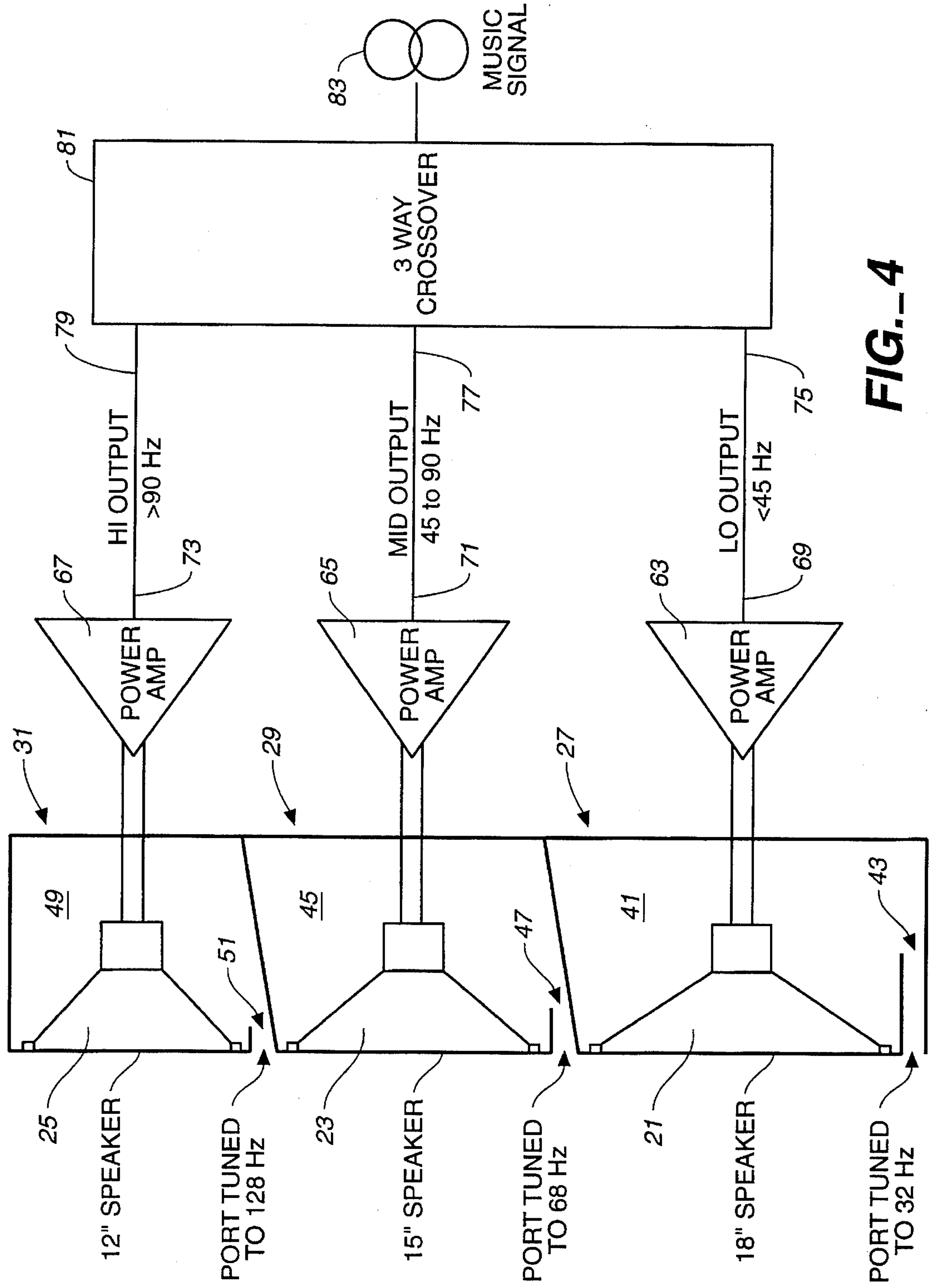
FIG. 4 is a schematic drawing of the bass reflex speaker system of the invention and the cross-over and power amplifier configuration used to drive the speaker system with a complex music signal.

This arrangement is illustrated in FIG. 4 which schematically shows the three acoustically isolated bass reflex modules 27, 29, 31 seen in FIG. 3, having drivers 21, 22, 23. Ports 43, 47, 51 for each of the reflex modules act to establish the operating bandwidth of the modules and to tune the modules to three different frequencies which are one octave apart in the low frequency band as above described. In other words, a lower bass reflex module 27, which is tuned to 32 Hertz and which operates over a one octave bandwidth, will have an operating frequency range that extends from 22.5 hertz to 45 Hertz. A middle bass reflex module 29 tuned to 68 Hertz will have an operating frequency range (one octave) from 45 to 90 Hertz. Finally, a top bass reflex module, suitably having the smaller 12 inch driver and which is tuned to 128 Hertz, (i.e., one octave above the middle frequency module) will have a bandwidth that extends from 90 to approximately 180 Hertz. Thus, it can be seen that the bass reflex system described covers substantially the entire low frequency bass region of the audio spectrum from below 20 Hertz to approximately 200 Hertz.

Referring further to FIG. 4, it can be seen that each of the bass reflex modules can be powered by separate power amplifiers 63, 65, 67 having amplifier inputs 69, 71, 73 which are connected to the outputs 75, 77, 79 of a three-way cross-over 81 which receives a music signal from a signal source denoted by the symbol 83. The outputs of the three-way cross-over divide the bass region of the music signal between three one octave frequency bands, as above-described, corresponding to the operating frequency range of the bass reflex modules being driven. Thus, it can be seen that the power amp 63 driving the lower bass reflex module 27 is driven only by frequency components below 45 Hertz, whereas the input to power amp 65 for driving the middle bass reflex module 29 is confined to frequencies between 45 and 90 Hertz. Similarly, the input to power amp 67 for driving the top bass reflex module 31 consists entirely of frequencies above 90 Hertz. It is understood that additional cross-over circuitry, suitably by providing a four-way crossover, will normally be required to direct high frequency signal components to the high frequency driver or drivers housed in the upper auxiliary chamber of the speaker enclosure or that are external to the enclosure. It is also understood that the operating bandwidth of the high frequency module 31 might be extended to cover frequencies above 200 Hertz to attempt to provide a more full range speaker system. However, it is believed that such an approach would not be very practical.

Therefore, it can be seen that the present invention provides for a bass reflex speaker system which has greater efficiencies than bass reflex systems heretofore known. More specifically, the invention provides for a bass reflex speaker system that can accurately reproduce a complex bass frequency signal at high sound pressure levels as required in commercial environments, without driving the individual drivers of the system to high excursion levels. While the invention has been described in considerable detail in the foregoing specification, it is understood that it is not intended that the invention be limited to such detail, except as necessitated by the following claims. For instance, while the bass reflex speaker system of the invention is described as a three-way system, it is intended that the invention encompass any multi-way system (including a two-way system) that acts to divide the bass frequency region, or portions thereof, between separate multiple, i.e. , two or more, acoustically isolated bass reflex modules having separate drivers. Also, while the system of the invention is described as having vertically adjacent drivers with the largest diameter driver being the bottom-most driver and the smallest driver being the top-most driver, it is understood that the drivers can be otherwise arranged (e.g., horizontally arranged or clustered) so long as they are all forward facing and relatively closely adjacent to each other to permit the acoustic signal produced by the drivers to permit vector addition of the acoustic signal in front of the speaker.

What I claim is:

1. A bass reflex speaker system comprising a first low frequency transducer facing forward into free space, a first ported chamber behind said first low frequency transducer, said first ported chamber being tuned to a first resonant frequency within the low frequency audio band, a second low frequency transducer facing forward into free space and disposed adjacent said first low frequency transducer, and a second ported chamber behind said second low frequency transducer, said second ported chamber being tuned to a second resonant frequency in the low frequency audio band different from said first resonant frequency said first and second ported chambers being acoustically isolated to prevent said first chamber from acoustically coupling to said second chamber.

2. The bass reflex speaker system of claim 1 wherein said first and second resonant frequencies are one octave apart.

3. The bass reflex system of claim 1 further comprising a third low frequency transducer facing forward into free space and disposed adjacent at least one of said first and second transducers, a third ported chamber behind said third low frequency transducer, said third ported chamber being tuned to a third resonant frequency within the low frequency audio band, said third ported chamber being acoustically isolated from said first and second ported chamber to prevent said third chamber from acoustically coupling to either of said first or second chambers.

4. The bass reflex system of claim 3 wherein said first, second and third resonant frequencies are separated by one octave.

5. The bass reflex system of claim 4 wherein said first, second and third resonant frequencies are, respectively, 32 Hertz, 64 Hertz, and 128 Hertz.

6. The bass reflex system of claim 3 wherein said transducers each have a circular piston member of a characteristic diameter and wherein the piston members of the first, second and third transducers have the following diameters, respectively: 18 inches, 15 inches, and 12 inches.

7. The bass reflex system a claim 6 wherein said ported chambers each have a characteristic volume and wherein the first, second, and third ported chambers have the following volumes, respectively: 6 cubic feet, 4 cubic feet, and 2 cubic feet.

8. A bass reflex speaker system comprising a speaker enclosure having a front baffle wall facing forward into free space, and at least two low frequency transducers mounted to said front baffle wall, each of said transducers having a piston member of a characteristic size which displaces a given volume of air for a given excursion of the pistons, said speaker enclosure having an internal volume behind said front baffle wall and internal partition walls for partitioning said internal volume into at least two separate chambers having different volumes, each of said transducers being mounted to said front baffle wall in front of a separate one of said transducer chambers, and each of said chambers being ported to provide separate bass reflex chambers tuned to different frequencies within the low frequency audio band and being acoustically isolated one from another to prevent one of said chambers from acoustically coupling to the other of said chambers.

9. The bass reflex speaker system of claim 8 wherein the piston members of said transducers are of different sizes.

10. The bass reflex speaker system of claim 9 wherein said separate bass reflex chambers are tuned one octave apart.

11. The bass reflex speaker system of claim 9 wherein at least three transducers are mounted to said front baffle wall and wherein the internal partition walls of said enclosure partition the internal volume thereof into at least there separate bass reflex chambers having different volumes such that each of said three transducers is mounted in front of a separate chamber, each of said three bass reflex chambers being isolated one from the other to prevent one of said chambers from acoustically coupling to the other of said chambers.

12. The bass reflex speaker system of claim 9 wherein the volumes of said bass reflex chambers are selected based on the size of the transducer's piston member to maximize the efficiency of transducers.

13. A bass reflex speaker system comprising a speaker enclosure having a front baffle wall facing forward into free space, three low frequency transducers mounted to said front baffle wall, each of said transducers having a circular piston member of a different characteristic diameter, said speaker enclosure having an internal volume behind said front baffle wall and internal partition walls for partitioning said internal volume into three separate transducer chambers having different volumes such that each of said transducers is mounted in front of a separate chamber, each of said chambers being isolated from one another acoustically to prevent one of said chambers from acoustically coupling to another of said chambers, and said chambers being ported to provide separate bass reflex transducer chambers tuned one octave apart within the low frequency audio band.

14. The bass reflex speaker system of claim 13 wherein the transducers have piston members of the following respective diameters: 18 inches, 15 inches, and 12 inches.

15. The bass reflex speaker system of claim 14 wherein the volumes and the tuning of said bass reflex chambers have the following approximate values based on the diameter of the transducers piston member associated with said chamber: for a piston diameter of 18 inches, a volume of 6 cubic feet and a tuning of 32 Hertz; for a piston diameter of 15 inches, a volume of 4 cubic feet and a tuning of 64 Hertz; for a piston diameter of 12 inches a volume of 2 cubic feet and a tuning of 128 Hertz.

* * * * *